United States Patent [19]

Araki

[11] Patent Number: 5,338,392

[45] Date of Patent: Aug. 16, 1994

[54] METHOD FOR MANUFACTURING A LAMINATED PLATE USED IN A SEMICONDUCTOR DEVICE

[75] Inventor: Kouji Araki, Yokohama, Japan

[73] Assignee: Kabushiki Kaisha Toshiba, Kawasaki, Japan

[21] Appl. No.: 132,866

[22] Filed: Oct. 7, 1993

[30] Foreign Application Priority Data

Oct. 8, 1992 [JP] Japan ................... 4-270174

[51] Int. Cl.⁵ .................... B44C 1/22; C23F 1/00
[52] U.S. Cl. .................... 156/634; 156/629; 156/645; 156/656; 156/901
[58] Field of Search .......... 156/629, 630, 643, 634, 156/645, 654, 656, 659.1, 901, 902; 437/206, 217, 220; 29/827, 846

[56] References Cited

U.S. PATENT DOCUMENTS 3,993,411 11/1976 Babcock et al. ................ 403/271
5,062,916 11/1991 Aufderheide et al. ......... 156/902 X
5,240,551 8/1993 Matsumura et al. ............. 156/630

*Primary Examiner*—William Powell
*Attorney, Agent, or Firm*—Oblon, Spivak, McClelland, Maier & Neustadt

[57] ABSTRACT

In a method for manufacturing a laminated plate used in a semiconductor device according to the present invention, a conductive member is processed to form a frame and a wiring pattern supported by the frame integrally with each other, the wiring pattern is bonded to the major surface of a base member by high-temperature heating, using the frame as a guide, thereby to form a laminated layer, and the frame is removed from the laminated layer to form a desirable laminated plate.

4 Claims, 2 Drawing Sheets

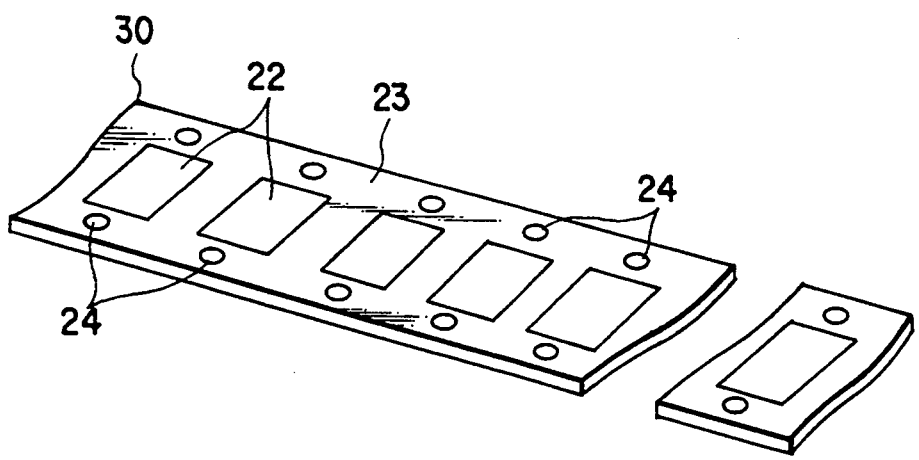
F I G. 2

METHOD FOR MANUFACTURING A LAMINATED PLATE USED IN A SEMICONDUCTOR DEVICE

BACKGROUND OF THE INVENTION

1. Field of the Invention

This invention relates to an improvement of method for manufacturing a laminated plate used in a semiconductor device.

As shown in FIG. 1, a conventional laminated plate 3 used in a semiconductor device, on which an IC chip 14 is placed, is formed on a heat sink 1 constituted by a Cu plate. A method for manufacturing the conventional laminated plate will now be described.

2. Description of the Related Art

The laminated plate 3 is a so-called coppered laminated plate which is constituted by bonding a wiring pattern 12 formed of copper or copper alloy to the surface of a ceramic base member 11 such as alumina ($Al_2O_3$) and aluminum nitride (AlN) and bonding a heat-radiating pattern 13 formed of copper or copper alloy to the undersurface thereof, using a high-temperature heating method such as a direct bonding method and an activated metal method. In FIG. 1, reference numeral 2 denotes an external electrode.

However, a wiring pattern has been reduced in size to meet the requirements for improving a degree of integration and a function of semiconductor devices, and has been increased in number to meet the requirements for increasing the number of outputs thereof. Inevitably, the wiring pattern 12 has to be positioned on the ceramic base member 11 with high precision. In order to position a number of wiring patterns 12 on the ceramic base member 11 with high precision, many hands and much time are needed, and manufacturing costs of the semiconductor devices are increased.

SUMMARY OF THE INVENTION

The present invention has been developed to eliminate the above drawback, and its object is to provide a method for manufacturing a laminated plate used in a semiconductor device in which a number of wiring patterns can be positioned on a base member with high precision thereby to shorten the time for manufacturing the laminated plate and decrease the cost therefor.

To attain the above object, there is provided a method for manufacturing a laminated plate used in a semiconductor device, comprising:

a step of processing a conductive member to form a frame and a wiring pattern supported by the frame integrally with each other;

a step of bonding the wiring pattern to a major surface of a base member by high-temperature heating, using the frame as a guide, thereby to form a laminated layer; and a step of removing the frame from the laminated layer to form a desirable laminated plate.

In the method for manufacturing a laminated plate according to the present invention, a wiring pattern can be positioned on a base member with high precision. If a number of wiring patterns are arranged together on the base member, the time for manufacturing the laminated plate can be shortened and the cost therefor can be decreased.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a partially perspective view showing one example of a conductive member used for manufacturing a laminated plate of a semiconductor device according to the present invention;

DETAILED DESCRIPTION OF THE PREFERRED EMBODIMENTS

One embodiment of the present invention will now be described, with reference to the accompanying drawings.

A conductive member 30 formed of film-like copper or copper alloy is prepared to form a pattern 22 and a frame 23, as is shown partially in the perspective view of FIG. 2.

Figure 1:
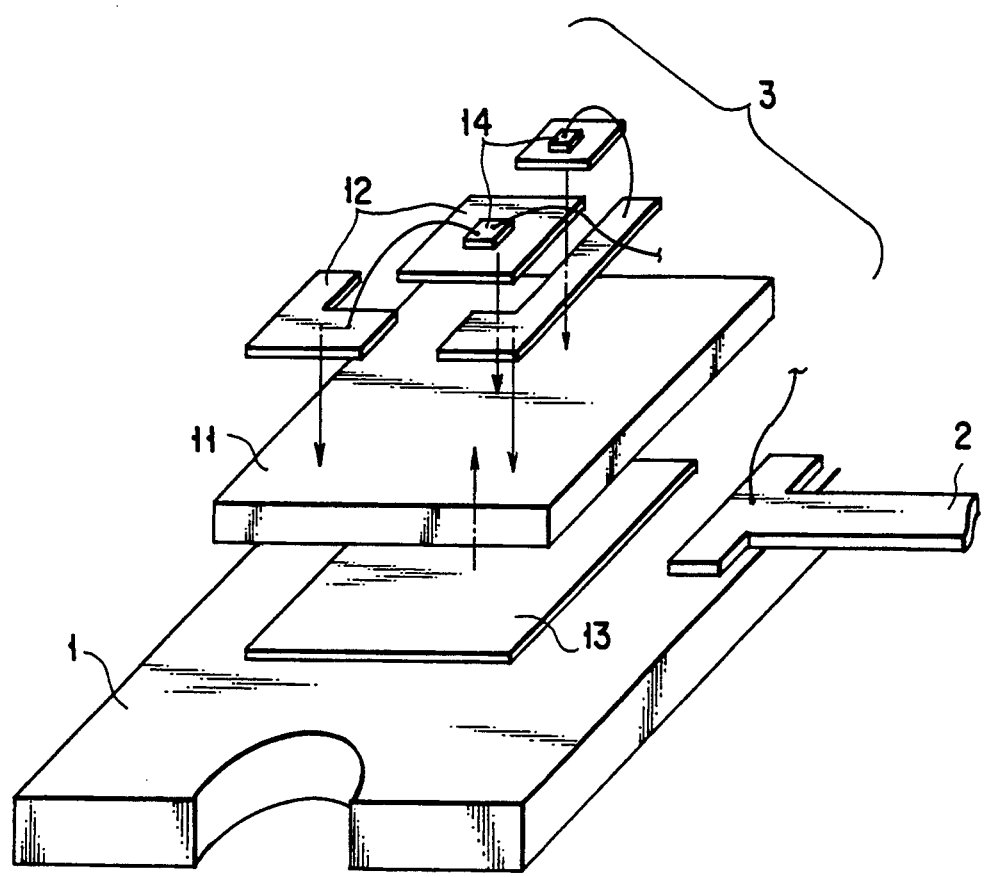
FIG. 1 is a view for explaining a method for manufacturing a conventional laminated plate used in a semiconductor device.
Figure 3:
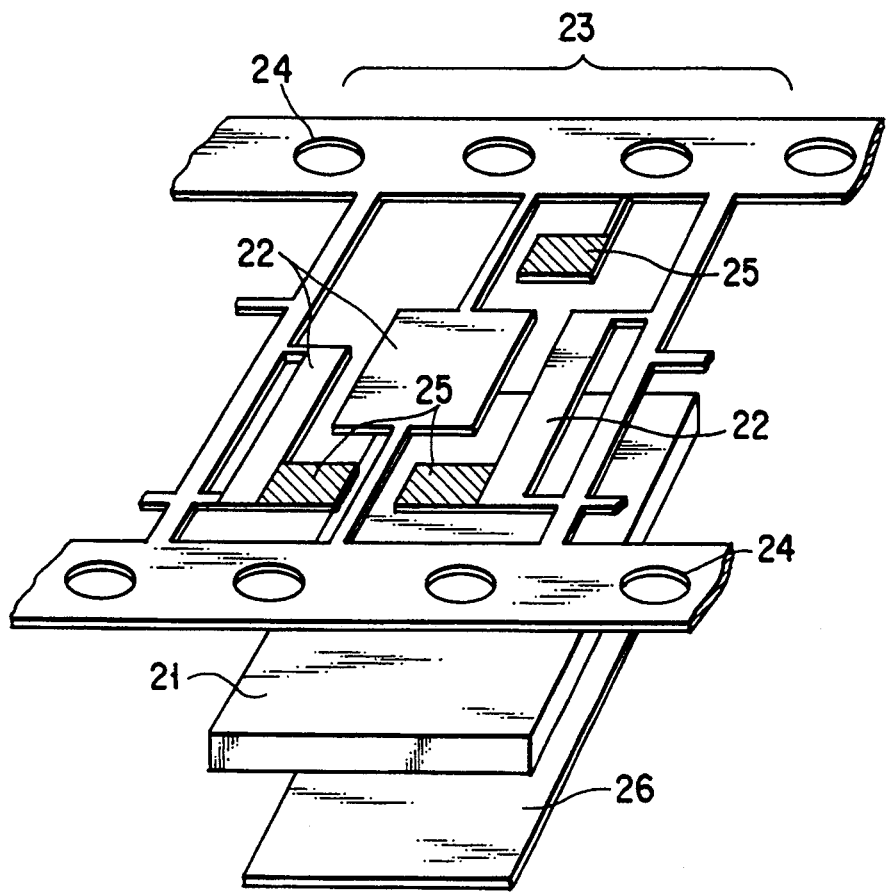
FIG. 3 is a view for explaining a method for manufacturing the laminated plate of the semiconductor device according to the present invention.

The conductive member 30 is pressed or etched to form the pattern 22 as shown in FIG. 3.

The pattern 22 is supported by the frame 23, and the pattern and the frame are formed integrally with each other as one component.

A plurality of positioning guide holes 24 are formed at substantially regular intervals on both sides of the frame 23 in its longitudinal direction.

The width of the conductive member 30 is substantially the same as that of a ceramic base member which will be described later.

As shown in FIG. 3, the pattern 22 is positioned using the guide holes 24 and arranged over one surface of a ceramic base member 21. The pattern 22 and the ceramic base member 21 are bonded to each other by heating them at a high temperature. A heat-radiating pattern 26 is bonded to the other surface of the ceramic base member 21.

Figure 4:
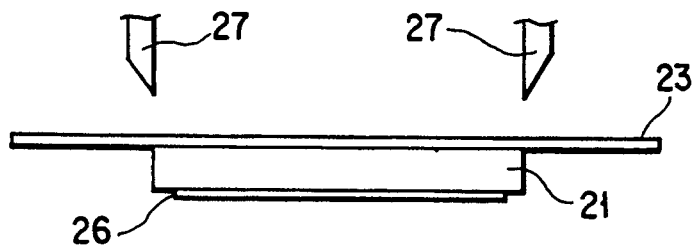
FIG. 4 is a view showing a step of removing a frame in the method of manufacturing the laminated plate of the semiconductor device according to the present invention.

After that, an undesired portion of the frame 23 is cut by using a mold, for example, by pressure of a press 27 as shown in FIG. 4. The undesired portion can be cut by using a laser in place of the press 27.

The method for manufacturing a laminated plate corresponding to a single pattern has been described above with reference to FIG. 3. If, however, plural successive patterns 22 are supported by the frame 23, they can be arranged together on the ceramic base member 21 with high precision. Moreover, the patterns can be arranged automatically using the guide holes, and the manufacture time can be shortened accordingly.

Since both sides of the conductive member can be etched, the patterns 22 can be formed minutely, which is advantageous to high degree of integration of the semiconductor device.

As shown in FIG. 3, partial plating 25 such as gold, silver and nickel is applied to an area of the film-like conductive member 30 corresponding to a bonding portion. After that, the patterns are formed by pressing or the like and bonded to the ceramic base member 21. Thus, the manufacturing cost can be reduced greatly, as compared to the conventional case where the complete plating is applied after the patterns are bonded to the ceramic base member.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method for manufacturing a laminated plate used in a semiconductor device, comprising:
   a step of processing a conductive member to form a frame and a wiring pattern supported by the frame integrally with each other;
   a step of bonding the wiring pattern to a major surface of a base member by high-temperature heating, using the frame as a guide, thereby to form a laminated layer; and
   a step of removing the frame from the laminated layer to form a desirable laminated plate.

2. The method according to claim 1, wherein said processing step includes one of pressing and etching.

3. The method according to claim 1, wherein said bonding step includes one of a direct bonding method and an activated metal method.

4. The method according to claim 1, further comprising a step of applying partial plating to a bonding portion before the wiring pattern is formed.

* * * * *